US008853698B1

(12) United States Patent
Chang

(10) Patent No.: US 8,853,698 B1
(45) Date of Patent: Oct. 7, 2014

(54) OXIDE SEMICONDUCTOR THIN FILM TRANSISTOR SUBSTRATE

(71) Applicant: Chunghwa Picture Tubes, Ltd., Taoyuan (TW)

(72) Inventor: Hsi-Ming Chang, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 14/078,494

(22) Filed: Nov. 12, 2013

(30) Foreign Application Priority Data

Aug. 13, 2013 (TW) ............................ 102215196 U

(51) Int. Cl.

*H01L 29/04* (2006.01)
*H01L 29/10* (2006.01)
*H01L 29/786* (2006.01)
*H01L 27/12* (2006.01)
*H01L 27/32* (2006.01)
*H01L 29/417* (2006.01)
*H01L 29/49* (2006.01)

(52) U.S. Cl.

CPC ........ *H01L 29/7869* (2013.01); *H01L 27/1214* (2013.01); *H01L 27/3244* (2013.01); *H01L 29/41733* (2013.01); *H01L 29/4908* (2013.01); *H01L 27/3248* (2013.01); *H01L 27/3262* (2013.01)

USPC ................................ 257/59; 257/72; 257/350

(58) Field of Classification Search

CPC ............ H01L 27/1214; H01L 29/4908; H01L 27/3244; H01L 29/7869; H01L 29/41733; H01L 27/3262; H01L 27/3248

USPC ............................................ 257/59, 72, 350

See application file for complete search history.

(56) References Cited

U.S. PATENT DOCUMENTS

2012/0187407 A1 7/2012 Choi et al.
2013/0001577 A1* 1/2013 Kim et al. ........................ 257/71
2013/0075723 A1* 3/2013 Yamazaki et al. .............. 257/43
2013/0234331 A1* 9/2013 Okumoto ....................... 257/744
2014/0028944 A1* 1/2014 Kanzaki et al. ................. 349/46
2014/0070210 A1* 3/2014 Yim et al. ....................... 257/43
2014/0175399 A1* 6/2014 Choi et al. ...................... 257/40

FOREIGN PATENT DOCUMENTS

JP 2011119693 A 6/2011
TW 201250925 12/2012

* cited by examiner

*Primary Examiner* — Ngan Ngo
(74) *Attorney, Agent, or Firm* — CKC & Partners Co., Ltd.

(57) ABSTRACT

An oxide semiconductor thin film transistor (TFT) substrate includes a substrate, a source, a drain, a patterned transparent conductive layer, an oxide semiconductor layer, a gate and a gate dielectric layer. The source and drain are disposed on the substrate. The patterned transparent conductive layer includes a first transparent electrode, a second transparent electrode and a pixel electrode. The first and second transparent electrodes respectively cover an upper surface of the source and an upper surface of the drain. The pixel electrode connects to the drain. The oxide semiconductor layer contacts the first and second transparent electrodes. The gate dielectric layer is interposed between the oxide semiconductor layer and the gate.

11 Claims, 6 Drawing Sheets

600

OXIDE SEMICONDUCTOR THIN FILM TRANSISTOR SUBSTRATE

RELATED APPLICATIONS

This application claims priority to Taiwanese Application Serial Number 102215196, filed Aug. 13, 2013, which is herein incorporated by reference.

BACKGROUND

1. Field of Invention

The present invention generally relates to an oxide semiconductor thin film transistor (TFT) substrate.

2. Description of Related Art

A liquid crystal display includes a thin film transistor (TFT) substrate, a color filter substrate and a liquid crystal molecule layer disposed therebetween. There are multiple TFTs disposed on the TFT substrate, and each of the TFTs includes a gate, a gate dielectric layer, a semiconductor layer, a source and a drain. The semiconductor layer may be made of a material including amorphous silicon, polycrystalline silicon, microcrystalline silicon, monocrystalline silicon, organic semiconductors, oxide semiconductors or other suitable materials.

Compared with the amorphous silicon TFT, the oxide semiconductor TFT possesses higher carrier mobility and thus exhibits better electrical performance. However, when an oxide semiconductor layer is formed, a surface of a metal layer, which contacts the oxide semiconductor layer, may be easily oxidized. For example, when the oxide semiconductor layer is formed on the source and the drain, the surfaces of the source and drain contacting the oxide semiconductor layer may be easily oxidized. As such, the contact resistance between the oxide semiconductor layer and the source and drain increases, which s deteriorates electrical performance of the oxide semiconductor TFT. In view of the above, an improved oxide semiconductor TFT substrate is currently required to address the above issue.

SUMMARY

One aspect of the present invention provides an oxide semiconductor thin film transistor (TFT) substrate, which is able to effectively avoid oxidation of a source and a drain when an oxide semiconductor layer is formed. The oxide semiconductor TFT substrate includes a substrate, a source, a drain, a patterned transparent conductive layer, an oxide semiconductor layer, a gate and a gate dielectric layer. The source and drain are disposed on the substrate. The patterned transparent conductive layer includes a first transparent electrode, a second transparent electrode and a pixel electrode. The first and second transparent electrodes respectively cover an upper surface of the source and an upper surface of the drain. The pixel electrode connects to the drain. The oxide semiconductor layer contacts the first and second transparent electrodes. The gate dielectric layer is interposed between the oxide semiconductor layer and the gate.

According to one embodiment of the present invention, an inner edge of the first transparent electrode is substantially aligned with an inner edge of the source.

According to one embodiment of the present invention, the first transparent electrode has a top profile view different from a top profile view of the source.

According to one embodiment of the present invention, the first transparent electrode further covers an inner edge of the source, and the oxide semiconductor layer does not contact the source.

According to one embodiment of the present invention, an inner edge of the second transparent electrode is substantially aligned with an inner edge of the drain.

According to one embodiment of the present invention, the second transparent electrode has a top profile view different from a top profile view of the drain.

According to one embodiment of the present invention, the second transparent electrode further covers an inner edge of the drain, and the oxide semiconductor layer does not contact the drain.

According to one embodiment of the present invention, the oxide semiconductor layer does not aligned with any edge of the first transparent electrode and any edge of the second transparent electrode.

According to one embodiment of the present invention, the second transparent electrode connects to the pixel electrode.

According to one embodiment of the present invention, the gate dielectric layer is disposed beneath the source and the drain, and the pixel electrode covers and contacts the gate dielectric layer.

According to one embodiment of the present invention, the gate dielectric layer is disposed over the source and the drain, and the pixel electrode covers and contacts the substrate.

BRIEF DESCRIPTION OF THE DRAWINGS

The invention may be more fully understood by reading the following detailed description of the embodiment, with reference made to the accompanying drawings as follows.

DETAILED DESCRIPTION

One aspect of the present invention provides an oxide semiconductor thin film transistor (TFT) substrate, which is able to effectively avoid oxidation of a source and a drain when an oxide semiconductor layer is formed. Various embodiments of oxide semiconductor substrates are exemplified below.

FIGS. 1A, 2A, 3A and 4A are top views of an oxide semiconductor thin film transistor (TFT) substrate at various processing stages according to one embodiment of the present invention. FIGS. 1B, 2B, 3B and 4B are cross-sectional views along line A-A' of FIGS. 1A, 2A, 3A and 4A respectively. Please refer to FIGS. 4A-4B, a bottom-gate type TFT substrate 400 includes a substrate 110, a source S, a drain D, a patterned transparent conductive layer T, an oxide semiconductor layer SE, a gate G and a gate dielectric layer 120. The patterned transparent conductive layer T includes a first transparent electrode T1, a second transparent T2 and a pixel electrode PE.

Figure 1A:
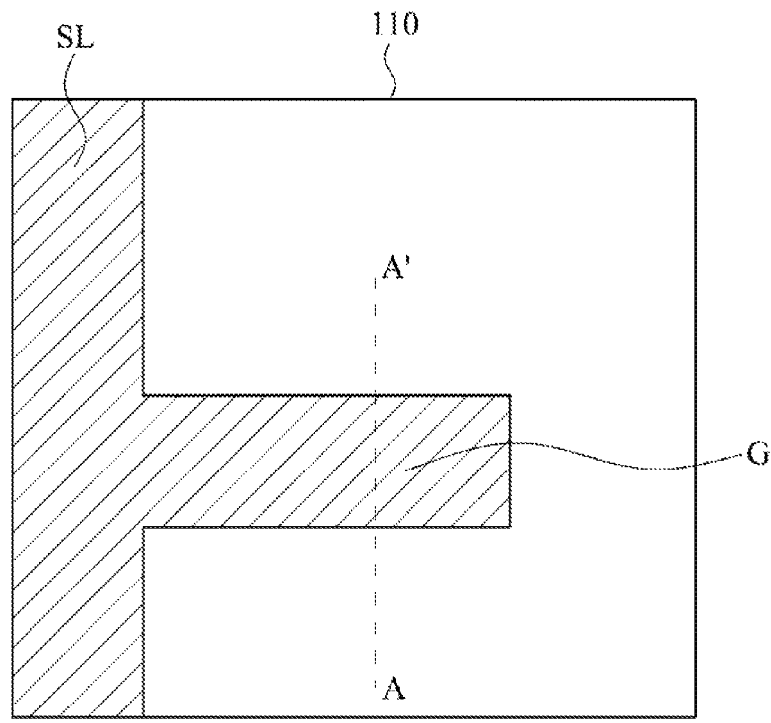
FIGS. 1A-1B 2A-2B, 3A-3B and 4A-4B are top and cross-sectional views of an oxide semiconductor thin film transistor (TFT) substrate at various processing stages according to one embodiment of the present invention.
Figure 1B:
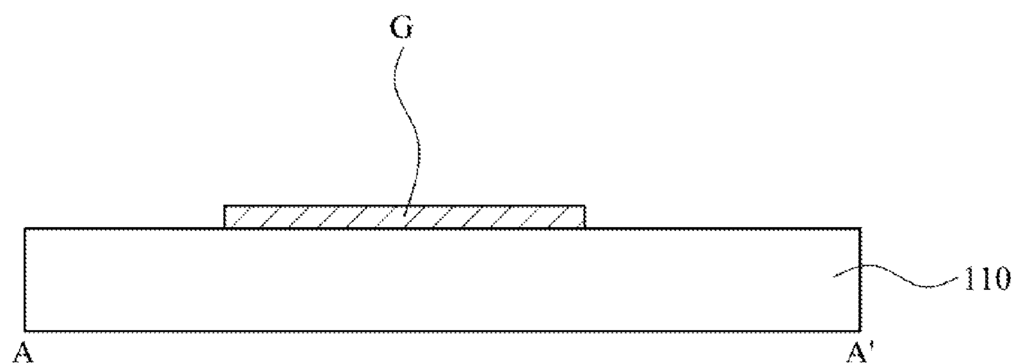

As shown in FIGS. 1A-1B, the gate G is disposed on the substrate 110. The substrate 110 should have sufficient mechanical strength, such as glass, quartz or transparent polymer materials. In the embodiment, the TFT substrate 400 further includes a scan line SL disposed on the substrate 110, and the gate G and the scan line SL are belongs to a same patterned conductive layer. The gate G and the scan line SL may be a single layer or a multilayer structure and made of metal or metal compound, such as molybdenum (Mo), chromium (Cr) aluminum (Al), neodymium (Nd), titanium (Ti), copper (Cu), silver (Ag), gold (Au), zinc (Zn), indium (In), gallium (Ga), other suitable materials or a combination thereof. For an instance, a metal layer (not shown) may be formed on the substrate 110 by sputtering, evaporation or other thin film deposition techniques, and then patterned by photolithographic and etching processes to form the gate G and the scan line SL.

Figure 2A:
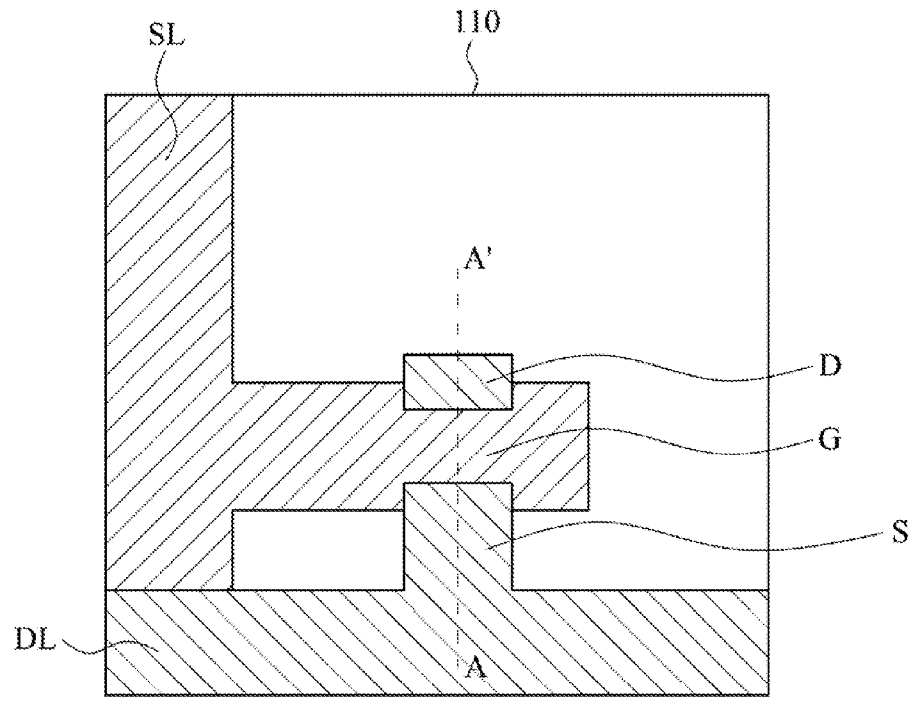
Figure 2B:
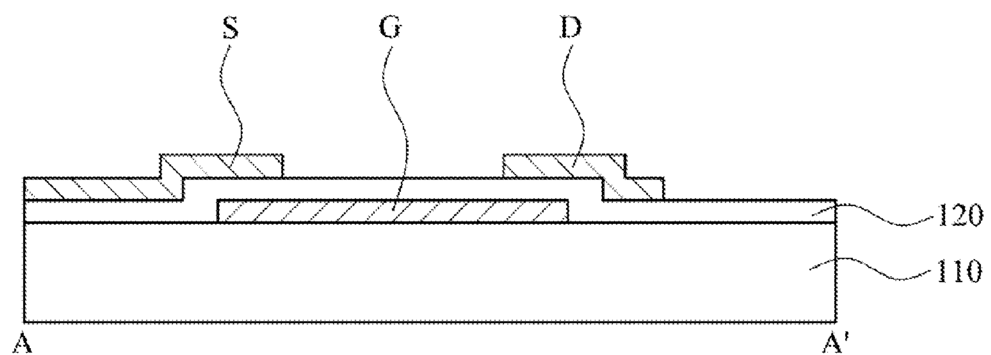

The gate dielectric layer 120 covers the gate G, as shown in FIG. 2B. The gate dielectric layer 120 may further cover the scan line SL. The gate dielectric layer 120 may be a single layer or a multilayer structure and made of organic dielectric materials or inorganic dielectric materials. The organic dielectric materials may be polyimide (PI). The inorganic dielectric materials may be silicon oxide, silicon nitride, silicon oxynitride or a combination thereof. The gate dielectric layer 120 may be formed by a chemical vapor deposition (CVD) method or other suitable thin film deposition techniques. The gate dielectric layer 120 is interposed between the oxide semiconductor layer SE and the gate G, as shown in FIG. 4B.

The source S and the drain D are disposed on the substrate 110, as shown in FIGS. 2A-2B. Specifically, the source S and the drain D are disposed on the gate dielectric layer 120. In the embodiment, the TFT substrate 400 further includes a data line DL disposed on the substrate 110, and the source S, the drain D and the data line DL belongs to a same patterned conductive layer. The source S, the drain D and the data line DL may be a single layer or multilayer structure, and the materials may be referred to those exemplified for the gate G and the scan line SL. For instances, a metal layer (not shown) may be formed on the gate dielectric layer 120 by sputtering, evaporation or other thin film deposition techniques, and then patterned by photolithographic and etching processes to form the source S, the drain D and the data line DL.

Figure 3A:
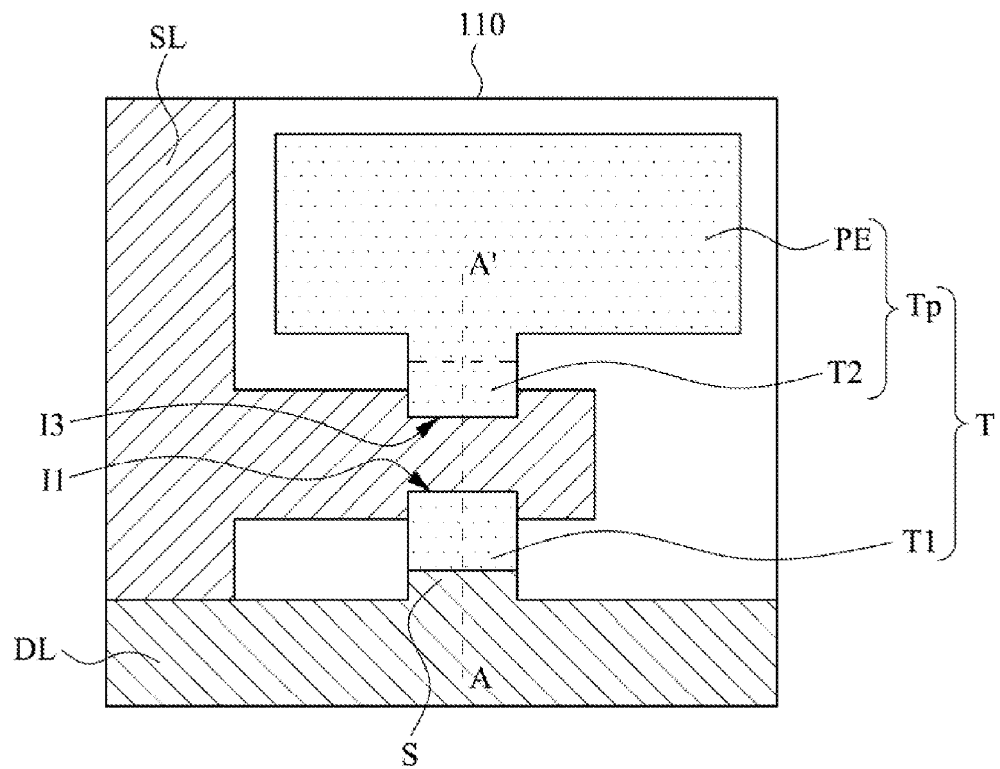
Figure 3B:
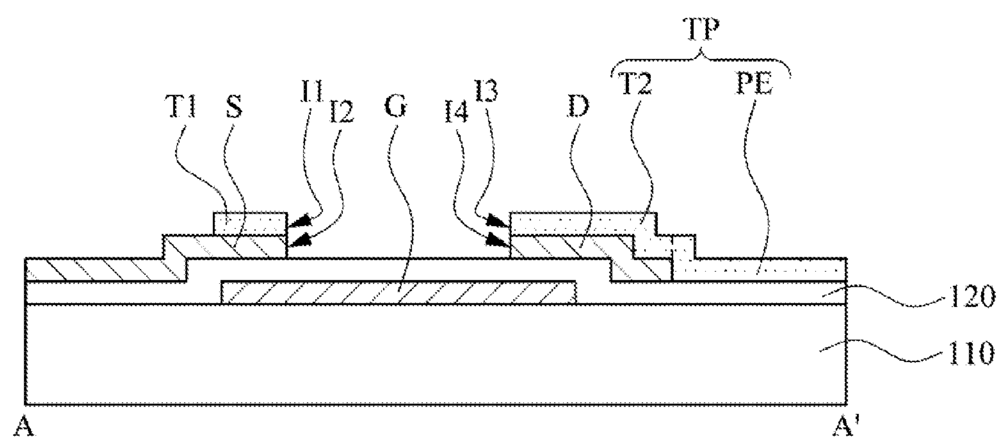

The patterned transparent conductive layer T is disposed on the source S, the drain D and the gate dielectric layer 120, as shown in FIGS. 3A-3B. The second transparent electrode T2 is connected to the pixel electrode PE, and the pixel electrode PE is connected to the drain D. The first transparent electrode T1 and the second transparent electrode T2 respectively cover an upper surface of the source S and an upper surface of the drain D. Therefore, the upper surfaces of the source S and the drain D are not exposed during a following step of forming the oxide semiconductor layer, so as to prevent oxidation of the source S and the drain D. In one embodiment, the first transparent electrode T1, the second transparent electrode T2 and the pixel electrode PE may be formed by a same photolithographic and etching processes with a photo mask, so as not to increase process time and cost. In the embodiment, the gate dielectric layer 120 is disposed beneath the source S and the drain D, and the pixel electrode PE covers and contacts the gate dielectric layer 120.

Specifically, the first transparent electrode T1 covers the source S, and an inner edge I1 of the first transparent electrode T1 is substantially aligned with an inner edge I2 of the source S. In another aspect, an inner edge 13 of the second transparent electrode T2 is substantially aligned with an inner edge I4 of the drain D. The first transparent electrode T1, the second transparent electrode T2 and the pixel electrode PE may be a single layer or a multilayer structure and made of a material such as indium tin oxide (ITO), aluminum zinc oxide (AZO), aluminum tin oxide (ATO), gallium zinc oxide (GZO), indium titanium oxide (ITiO), indium molybdenum oxide (IMO), other transparent conductive materials, or a combination thereof.

In another definition, the patterned transparent conductive layer T includes the first transparent electrode T1 and a portion Tp, as shown in FIG. 3A. The portion Tp includes the second transparent electrode T2 and the pixel electrode PE. Therefore, the second transparent electrode T2 may be defined as a portion of the portion Tp, which is disposed right above the upper surface of the drain D. The pixel electrode PE may be defined as another portion of the portion Tp, which is outside the second transparent electrode T2, as shown in FIGS. 3A-3B.

Figure 4A:
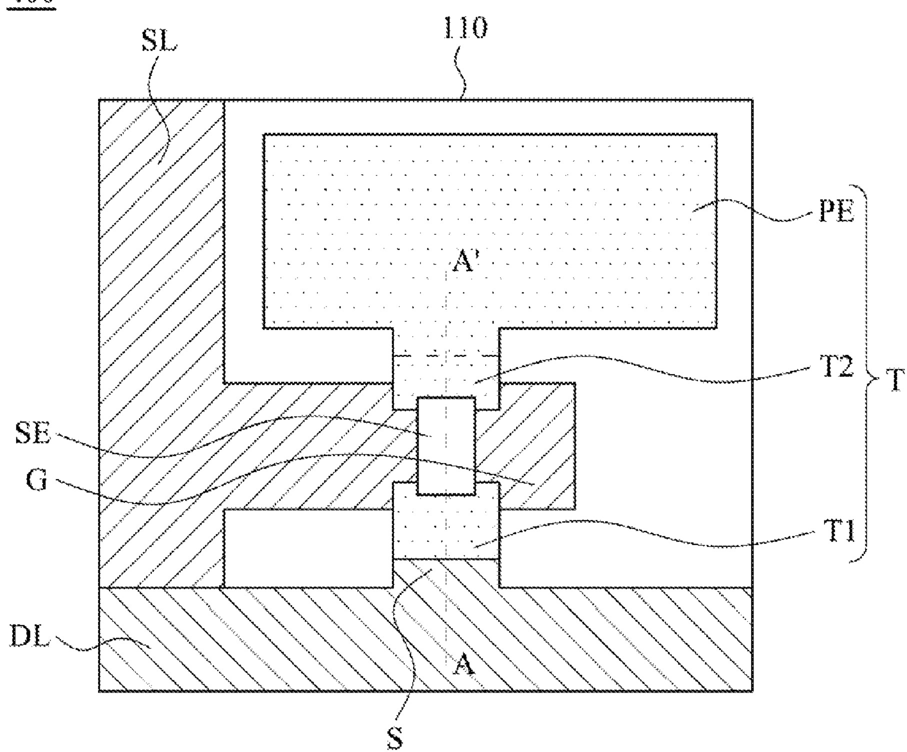
Figure 4B:
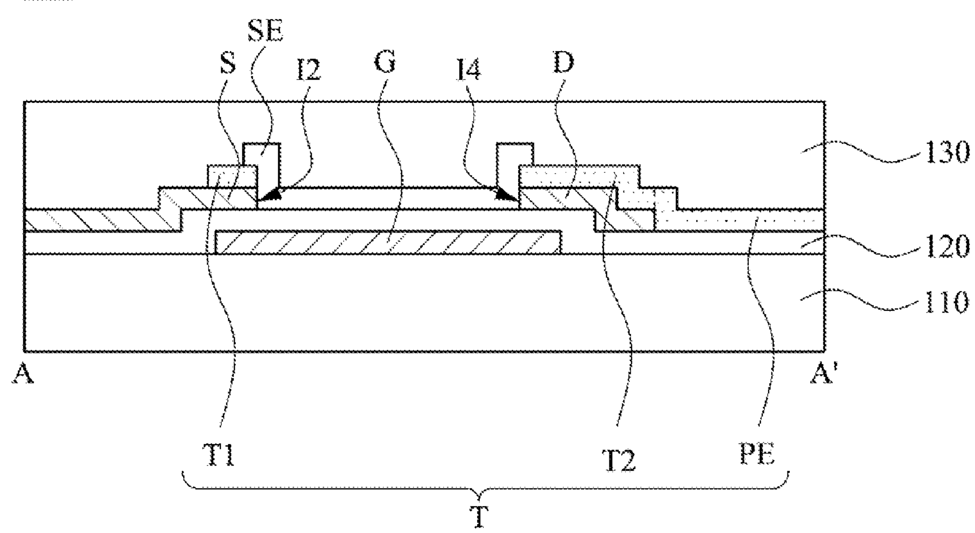

The oxide semiconductor layer SE contacts the first and second transparent electrodes T1, T2, as shown in FIGS. 4A-4B. Specifically, the oxide semiconductor layer SE is disposed on the first transparent electrode T1 and the second transparent electrode T2, and on the gate dielectric layer 120 between the source S and the drain D. The oxide semiconductor layer SE does not aligned with any edge of the first transparent electrode T1 and any edge of the second transparent electrode T2.

In addition, the bottom-gate type TFT substrate 400 may further include a passivation layer 130 fully covering the oxide semiconductor layer SE, the first transparent electrode T1, the second transparent electrode T2 and the pixel electrode PE, as shown in FIG. 4B. The passivation layer 130 may be a single layer or a multilayer structure, and the materials may be referred to those exemplified for the gate dielectric layer 120.

Figure 5A:
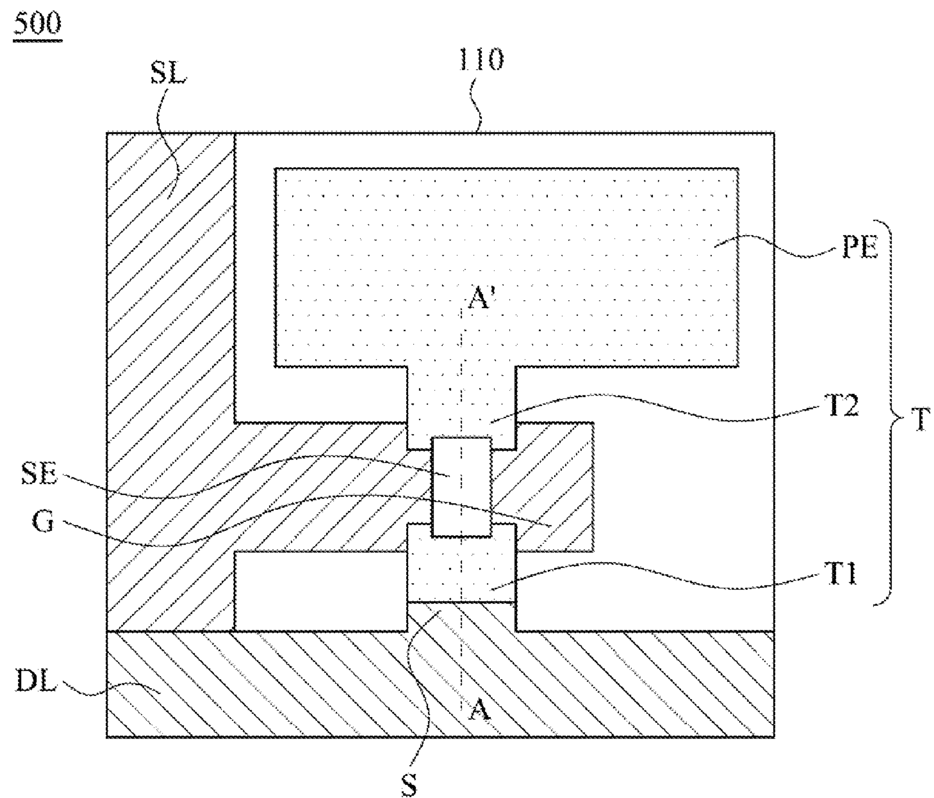
FIGS. 5A-5B are top and cross-sectional views of an oxide semiconductor TFT substrate according to another embodiment of the present invention.
Figure 5B:
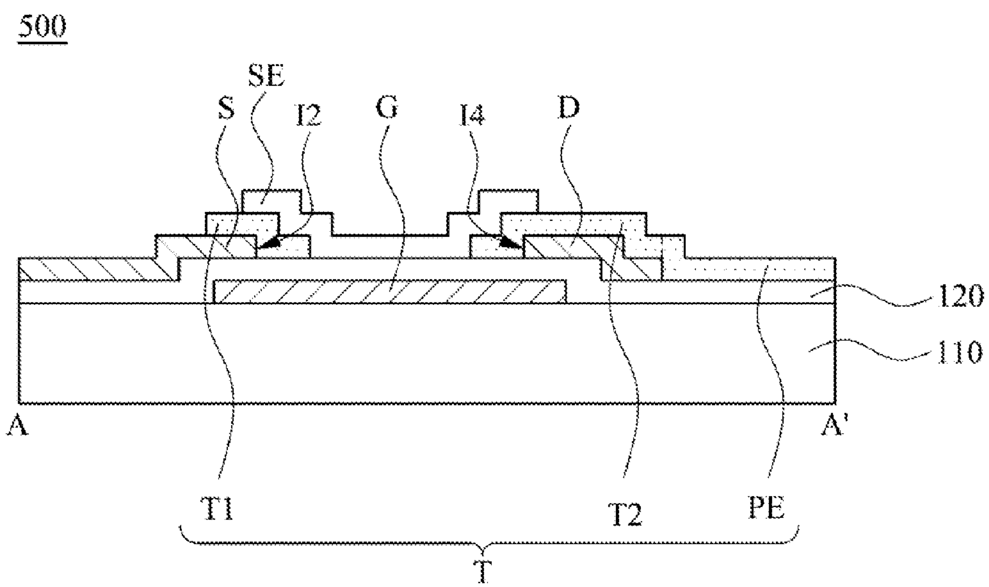

In another embodiment, as shown in FIGS. 5A-5B, a bottom-gate type TFT substrate 500 includes a substrate 110, a source S a drain D, a patterned transparent conductive layer T, an oxide semiconductor layer SE, a gate G and a gate dielectric layer 120. The patterned transparent conductive layer T includes a first transparent electrode T1, a second transparent electrode T2 and a pixel electrode PE. In particular, the first transparent electrode T1 of the TFT substrate 500 has a top profile view different from a top profile view of the source S. Specifically, the first transparent electrode T1 further covers an inner edge I2 of the source S, such that the oxide semiconductor layer SE cannot contact the source S. Further, the second transparent electrode T2 has a top profile view different from a top profile view of the drain D. The second transparent electrode T2 further covers an inner edge I4 of the drain D, such that the oxide semiconductor layer SE cannot contact the drain D. Accordingly, the source S and the drain D are fully protected by the first transparent electrode T1 and the second transparent electrode T2 so as not to be oxidized when the oxide semiconductor layer SE is formed, and thus the contact resistance would not increase.

Figure 6:
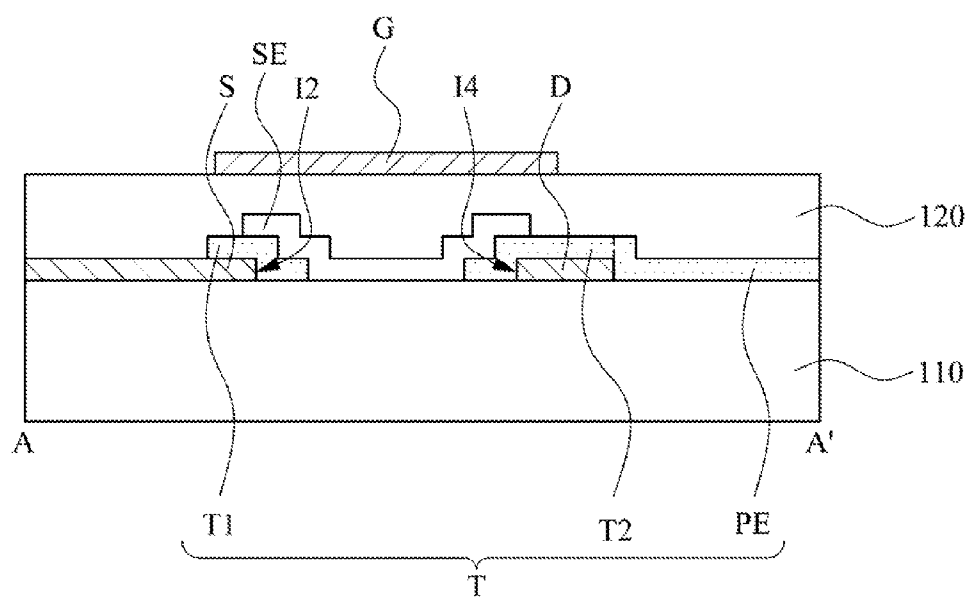
FIG. 6 is a cross-sectional view of an oxide semiconductor TFT substrate according to another embodiment of the present invention.

In another embodiment, as shown in FIG. 6, a top-gate type TFT substrate 600 includes a substrate 110, a source S, a drain D, a patterned transparent conductive layer T, an oxide semiconductor layer SE, a gate G and a gate dielectric layer 120. The patterned transparent conductive layer T includes a first transparent electrode T1, a second transparent electrode T2 and a pixel electrode PE. The source S and drain D are disposed on the substrate 110 and directly contact the substrate 110. The first and second transparent electrodes T1, T2 respectively cover an upper surface of the source S and an upper surface of the drain D. The pixel electrode PE is connected to the drain D. The oxide semiconductor layer SE contacts the first and second transparent electrodes T1, T2. The gate dielectric layer 120 is interposed between the oxide semiconductor layer SE and the gate G. In the embodiment, the gate dielectric layer 120 is disposed over the source S and the drain D, and the pixel electrode PE covers and contacts the substrate 110.

Similar to those embodiments mentioned above, the first and second transparent electrodes T1, T2 not only respectively cover the upper surface of the source S and the upper surface of the drain D, but also respectively cover an inner edge I2 of the source S and an inner edge I4 of the drain D. Therefore, the source S and the drain D are fully protected by the first transparent electrode T1 and the second transparent electrode T2 so as not to be oxidized when the oxide semiconductor layer SE is formed, and thus the contact resistance would not increase.

Given the above, because the source and the drain may be respectively protected by the first and second transparent electrodes, they are not easily be oxidized when the oxide semiconductor layer is formed, and thus the contact resistance is not affected. In addition, the first and second transparent electrodes and the pixel electrode may be formed by a same photolithographic and etching processes with a photo mask, so as not to increase process time and cost.

It will be apparent to those ordinarily skilled in the art that various modifications and variations may be made to the structure of the present invention without departing from the scope or spirit of the invention. In view of the foregoing, it is intended that the present invention cover modifications and variations thereof provided they fall within the scope of the following claims.

What is claimed is:

1. An oxide semiconductor thin film transistor (TFT) substrate, comprising:

a substrate;

source and a drain disposed on the substrate;

a patterned transparent conductive layer including a first transparent electrode, a second transparent electrode and a pixel electrode, the first transparent electrode and the second transparent electrode respectively covering an upper surface of the source and an upper surface of the drain, the pixel electrode connecting to the drain;

an oxide semiconductor layer contacting the first transparent electrode and the second transparent electrode;

a gate; and a gate dielectric layer interposed between the oxide semiconductor layer and the gate.

2. The oxide semiconductor TFT substrate of claim 1, wherein an inner edge of the first transparent electrode is substantially aligned with an inner edge of the source.

3. The oxide semiconductor TFT substrate of claim 1, wherein the first transparent electrode has a top profile view different from a top profile view of the source.

4. The oxide semiconductor TFT substrate of claim 3, wherein the first transparent electrode further covers an inner edge of the source, and the oxide semiconductor layer does not contact the source.

5. The oxide semiconductor TFT substrate of claim 1, wherein an inner edge of the second transparent electrode is substantially aligned with an inner edge of the drain.

6. The oxide semiconductor TFT substrate of claim 1, wherein the second transparent electrode has a top profile view different from a top profile view of the drain.

7. The oxide semiconductor TFT substrate of claim 6, wherein the second transparent electrode further covers an inner edge of the drain, and the oxide semiconductor layer does not contact the drain.

8. The oxide semiconductor TFT substrate of claim 1, wherein the oxide semiconductor layer does not aligned with any edge of the first transparent electrode and any edge of the second transparent electrode.

9. The oxide semiconductor TFT substrate of claim 1, wherein the second transparent electrode connects to the pixel electrode.

10. The oxide semiconductor TFT substrate of claim 1, wherein the gate dielectric layer is disposed beneath the source and the drain, and the pixel electrode covers and contacts the gate dielectric layer.

11. The oxide semiconductor TFT substrate of claim 1, wherein the gate dielectric layer is disposed over the source and the drain, and the pixel electrode covers and contacts the substrate.

* * * * *